US010790021B2

(12) United States Patent
Hu (10) Patent No.: US 10,790,021 B2
(45) Date of Patent: Sep. 29, 2020

(54) EEPROM, AND METHODS FOR ERASING, PROGRAMMING AND READING THE EEPROM

(71) Applicant: Shanghai Huahong Grace Semiconductor Manufacturing Corporation, Shanghai (CN)

(72) Inventor: Jian Hu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 15/948,487

(22) Filed: Apr. 9, 2018

(65) Prior Publication Data

US 2019/0147953 A1  May 16, 2019

(30) Foreign Application Priority Data

Nov. 14, 2017 (CN) .......................... 2017 1 1120987

(51) Int. Cl.
| | |
|---|---|
| G11C 16/04 | (2006.01) |
| G11C 16/14 | (2006.01) |
| G11C 16/08 | (2006.01) |
| H01L 27/11521 | (2017.01) |
| G11C 16/10 | (2006.01) |
| G11C 16/26 | (2006.01) |
| H01L 27/11519 | (2017.01) |
| G11C 16/24 | (2006.01) |

(52) U.S. Cl.
CPC .......... *G11C 16/0425* (2013.01); *G11C 16/08* (2013.01); *G11C 16/10* (2013.01); *G11C 16/14* (2013.01); *G11C 16/24* (2013.01); *G11C 16/26* (2013.01); *H01L 27/11519* (2013.01); *H01L 27/11521* (2013.01)

(58) Field of Classification Search
CPC ......... H01L 27/11521; H01L 27/11563; H01L 27/11519; G11C 16/0425; G11C 16/24; G11C 16/26; G11C 16/10; G11C 16/08; G11C 16/14; G11C 16/12; G11C 16/0433
See application file for complete search history.

(56) References Cited

U.S. PATENT DOCUMENTS

| | | | | |
|---|---|---|---|---|
| 5,745,417 A | * | 4/1998 | Kobayashi ......... | G11C 16/0408 365/185.29 |
| 5,898,606 A | * | 4/1999 | Kobayashi ......... | G11C 16/0408 365/63 |

(Continued)

*Primary Examiner* — Mushfique Siddique
(74) *Attorney, Agent, or Firm* — Harness, Dickey & Pierce, P.L.C.

(57) ABSTRACT

An EEPROM and methods for erasing, programming and reading it, the EEPROM includes a plurality of split-gate storage arrays, each of the plurality of split-gate storage cells including a source connected with a first bit line, a drain connected with a second bit line, a first control gate connected with a first store position, a word line gate connected with a word line and a second control gate connected with a second store position; and the first control gate is connected with a first control gate line, and the second control gate is connected with a second control gate line, wherein every N columns of the split-gate storage cells are formed on a first well structure, adjacent first well structures are separated by a second well structures having a different doping type with that of the first well structures, and N is a positive integer.

12 Claims, 7 Drawing Sheets

(56) References Cited

U.S. PATENT DOCUMENTS

| | | | | |
|---|---|---|---|---|
| 6,181,607 B1* | 1/2001 | Lee | ............... | G11C 16/0425 365/185.05 |
| 6,606,265 B2* | 8/2003 | Bergemont | ........ | G11C 16/0416 257/E27.103 |
| 6,697,281 B2* | 2/2004 | Hoang | ............ | G11C 16/0425 365/185.11 |
| 6,862,223 B1* | 3/2005 | Lee | ............... | H01L 27/11524 257/E27.103 |
| 7,269,063 B2* | 9/2007 | Chih | ............... | G11C 16/0425 365/185.05 |
| 9,640,252 B1* | 5/2017 | Yang | ............... | G11C 11/5628 |
| 2003/0095436 A1* | 5/2003 | Hoang | ............... | G11C 16/16 365/185.17 |
| 2014/0169099 A1* | 6/2014 | Gu | ............... | H01L 21/28273 365/185.18 |
| 2016/0148942 A1* | 5/2016 | Yang | ............... | G11C 16/0408 365/185.29 |

* cited by examiner

Figure 6 selecting the first store position by configuring voltages of the first bit line, the second bit line, the word line, the first control gate line, the second control gate line and the first well structure to make the first store position stay in a pre-programming status and prevent the second store position from staying in the pre-programming status; wherein there is a channel current flowing in a channel of the split-gate storage cell, and the channel current flows from the first store position to the second store position — S31 programming the first store position — S33

Figure 7 selecting the first store position by configuring voltages of the first bit line, the second bit line, the word line, the first control gate line, the second control gate line and the first well structure to make the first store position stay in a pre-programming status and prevent the second store position from staying in the pre-programming status; wherein there is a channel current flowing in a channel of the split-gate storage cell, and the channel current flows from the second store position to the first store position — S41 reading data stored in the first store positions — S43

Figure 8

EEPROM, AND METHODS FOR ERASING, PROGRAMMING AND READING THE EEPROM

CROSS-REFERENCE TO RELATED APPLICATIONS

This application claims the benefit of priority to Chinese Patent Application No. 201711120987.0, filed on Nov. 14, 2017, the entire disclosure of which is incorporated herein by reference.

TECHNICAL FIELD

The present disclosure relates to the field of memory, and more particularly, to an EERPROM and methods for erasing, programming and reading the EEPROM.

BACKGROUND

Electrically erasable programmable read only memory (EEPROM) is a kind of memory chip that can retrieve stored data after being powered off. EEPROM may be erased and programmed (rewritten) under a voltage higher than a normal voltage. During operation, EEROM requires byte (8 bits) as a unit of operation. EEPROM is generally used on plug-and-play elements, interface cards to store hardware configuration data and hardware locks that prevent unauthorized copies of software.

Existing EEPROM is constructed with split-gate structures. Specifically, the split-gate structure is a floating-gate tunneling oxide transistor (FLOTOX). EEPROM may contain a plurality of FLOTOXs and additional gating transistors. As the split-gate structures avoid over-erase effect effectively, circuit design may be relatively simple. Besides, the split-gate structures use source hot electrons injection to program, programming efficiency is relatively high. In existing techniques, when data stored in the floating-gates of the structures in the EEPROM (that is, electrons injected into the plurality of floating-gates) are erased, a tunneling effect between the floating-gates and sources are used. Electrons injected into the floating-gates are drawn to the sources via a tunnel current, thereby electrons are no longer stored in the floating-gates, so as to realize erasure of the EEPROM.

However, each of the plurality of split-gate structures includes two floating-gates, which construct two store positions mirroring with each other. Therefore when injected electrons in one of the two floating-gates are erased, the other one of the two floating-gates may be interfered, which leads to an erroneously erasure. On base of this, two store positions of each split-gate structure of the EEPROM may generally serve as one effective store position for operation (for example, erasure, programming and reading), thus, an area utilization of the existing EEPROM is relatively low.

SUMMARY

Embodiments provided by the present disclosure may improve an area utilization of an EEPROM effectively.

Embodiments of the present disclosure provide an electrically erasable programmable read only memory (EEPROM), including a plurality of split-gate storage cells arranged in arrays, each of the plurality of split-gate storage cells including a source, a drain, a first control gate connected with a first store position, a word line gate and a second control gate connected with a second store position, the word line gate being connected with a word line, the source being connected with a first bit line, the drain being connected with a second bit line, wherein the first control gate is connected with a first control gate line, and the second control gate is connected with a second control gate line different with the first control gate line, wherein every N columns of split-gate storage cells are formed on a first well structure, and adjacent first well structures are separated by a second well structures having a different doping type with that of the first well structures, and N is a positive integer.

Optionally, the first well structure is P-type, and the second well structure is N-type.

Optionally, the first well structure and the second well structure are formed on a highly doped N well.

Optionally, N may be 8.

Embodiments of the present disclosure provide a method for erasing the EEPROM, including: applying a first well voltage to the first well structure where a particular split-gate storage cell is disposed; applying an erasure voltage to the first control gate line; applying a first control voltage different from the erasure voltage to the second control gate line; applying an word line voltage to the word line, the word line voltage being lower than the first well voltage; applying a first bit line voltage to the first bit line; applying a second bit line voltage to the second bit line; wherein a voltage difference between the first well voltage and the erasure voltage makes electrons stored on the first store position be erased, and a voltage difference between the first well voltage and the first control voltage prevents electrons stored on the second store position from being erased.

Optionally, the first well voltage is within a range from 8 V to 12 V, the erasure voltage is within a range from 6 V to −10 V, the first control voltage is within a range from 0 V to 4 V, and the word line voltage is within a range from −2 V to 2 V.

Optionally, the first bit line voltage and the second bit line voltage are equal to the first well voltage.

Optionally, the method including, applying a second well voltage to the first well structures where the split-gate storage cell at a same row with the particular split-gate storage cell are disposed, to prevent electrons stored in the first store positions of the split-gate storage cells disposed at the same row with the particular split-gate storage cell from being erased.

Optionally, the second well voltage is within a range from −2 V to 2 V.

Optionally, the method for erasing the EEPROM further including: applying a second control voltage to the first control gate lines where the split-gate storage cells at a same column with the particular split-gate storage cell are disposed to prevent electrons stored in the first store positions of the split-gate storage cells disposed at the same column with the split-gate storage cell from being erased, wherein the second control voltage is equal to or not equal to the first control voltage.

Optionally, the second control voltage is within a range from 0 V to 4 V.

Embodiments of the present disclosure provide a for programming the EEPROM, including: selecting the first store position by configuring voltages of the first bit line, the second bit line, the word line, the first control gate line, the second control gate line and the first well structure to make the first store position stay in a pre-programming status and prevent the second store position from staying in the pre-programming status; wherein there is a channel current flowing in a channel of the split-gate storage cell, and the channel current flows from the first store position to the second store position; and programming the first store position.

Optionally, selecting the first store position by applying a voltage within a range from 3 V to 7 V to the first bit line, applying a voltage within a range from 0.1 V to 0.5 V to the second bit line, applying a voltage within a range from 1 V to 2 V to the word line, applying a voltage within a range from 7 V to 10 V to the first control gate line, applying a voltage within a range from 3 V to 7 V to the second control gate line, and applying a voltage within a range from −2 V to 2 V to the first well structure to make the channel current flow in the channel of the split-gate storage cell.

Embodiments of the present disclosure provide a method for reading the EEPROM, including: selecting the first store position by configuring voltages of the first bit line, the second bit line, the word line, the first control gate line, the second control gate line and the first well structure to make the first store position stay in a pre-programming status and prevent the second store position from staying in the pre-programming status; wherein there is a channel current flowing in a channel of the split-gate storage cell, and the channel current flows from the second store position to the first store position; and reading data stored in the first store position.

Optionally, selecting the first store position by applying a voltage of 0 V to the first bit line, applying a voltage within a range from 0.5 V to 1 V to the second bit line, applying a voltage within a range from 4 V to 5 V to the word line, applying a voltage of 0 V to the first control gate line, applying a voltage within a range from 4 V to 5 V to the second control gate line, and applying a voltage within a range from −2 V to 2 V to the first well structure to make the channel current flow in the channel of each of the split-gate storage cell.

Compared with the existing techniques, embodiments of the embodiments of the present disclosure have the following advantages.

In the EEPROM provided in the embodiments of the present disclosure, every N columns of the plurality of split-gate storage cells are formed on one first well structure, and adjacent first well structures are separated by the second well structure having a different doping type with that of the first well structures. Therefore, if an operation, for example, erasure, is performed to the split-gate storage cell in the EEPROM, voltages of the first well structure where the split-gate storage cell is disposed and the first control gate line may be configured to realize erasure of the data stored in the first store position of the split-gate storage cell, or voltages of the first well structure where the split-gate cell is disposed and the second control gate line may be configured to realize erasure of the data stored in the second store position, without using a voltage difference between the word line and the first control gate line or between the word line and the second control gate line to realize data erasure, which may avoid operation interference among different store positions in the same split-gate storage cell effectively, and operation interference of storage positions in split-gate storage cells disposed at a same row as well as a same column with the split-gate storage cell, make the two store positions in each of the plurality of split-gate storage cells be effective store positions, and improve area utilization of the EEPROM. Further, in the EEPROM, gating transistors are not needed to select multiple columns of split-gate storage cells in the EEPROM to perform operation, and only an appropriate voltage needs to be applied on the first well structure where the multiple columns of split-gate storage cells are disposed, which may further reduce an area of the EEPROM, and improve area utilization of the EEPROM.

DETAILED DESCRIPTION

As described in the background, each of the plurality of split-gate structures includes two floating-gates which construct two store positions mirroring with each other. Therefore when injected electrons in one of the two floating-gates are erased, the other one of the two floating-gates may be interfered, which leads to an erroneously erasure. Therefore, two store positions of each split-gate structures of the existing EEPROM may generally server as one effective store position for operation (for example, erasure, programming and reading), thus, an area utilization of the existing EEPROM is relatively low.

Inventors have made an analysis on an existing EEPROM.

Figure 1:
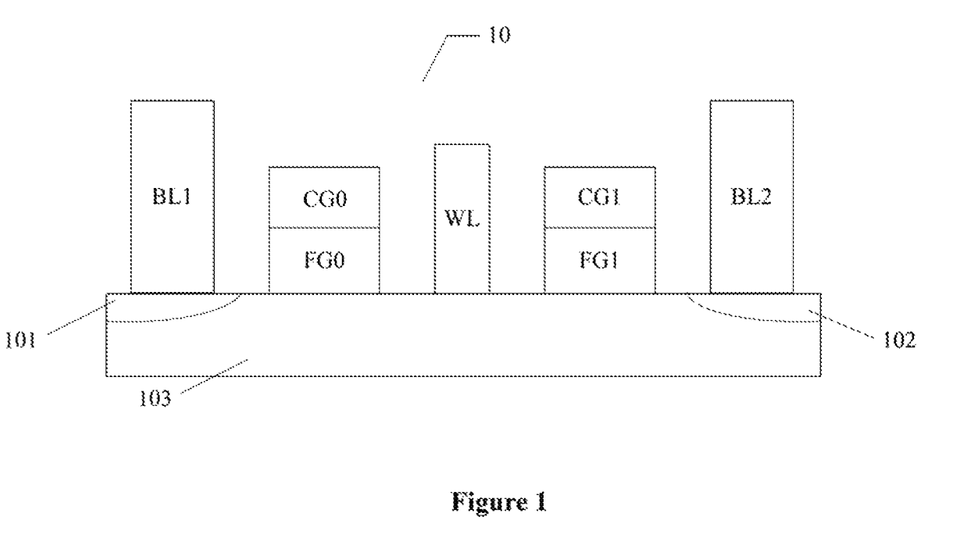
FIG. 1 is a cross-sectional view of a split-gate storage cell of an EEPROM in existing techniques.

Firstly, the existing EEPROM includes a plurality of split-gate storage cells arranged in arrays. FIG. 1 is a cross-sectional view of a split-gate storage cell of an existing EEPROM. As shown in FIG. 1, a split-gate storage cell 10 may include a source (not marked), a drain (not marked), a first control gate CG0 connected with a first floating-gate FG0, a word line gate WL, and a second control gate CG1 connected with a second floating-gate FG1, and the first floating-gate FG0 and the second floating-gate FG1 are two store positions mirroring with each other. Besides, the source and the drain are connected with a source area 101 and a drain area 102 formed by N+ doped regions, respectively; a P-doped channel area 103 is formed between the source area 101 and the drain area 102, a surface of the channel area 103 is used to form a channel for connecting the source area 101 with the drain area 102. The first floating-gate FG0, the first control gate CG0, the word line gate WL, the second floating-gate FG1 and the second control gate CG1 are formed above the channel area 103, and the first control gate CG0, the word line gate WL, the second floating-gate FG1 and the second control gate CG1 are sequentially arranged side by side between the source area 101 and the drain area 102. The first control gate CG0 and the second control gate CG1 are disposed \symmetrically on both sides of the word line gate WL, and the source area 101 and the drain area 102 are disposed symmetrically. The source may be connected with the first bit line BL1, and the drain may be connected with the second bit line BL2.

Specifically, if erasure is performed to data (that is, electrons injected into a floating-gate) stored in a first store position (that is, the first floating-gate) FG0 or/and the second store position (that is, the second floating-gate), a voltage of 0 V may be applied to the first bit line BL1 and the second bit line BL2, a voltage of 8.5 V may be applied to the word line gate WL, and a voltage of 7 V may be applied to the first control gate CG0 and/or a voltage of 7 V may be applied to the second control gate CG1, to realize erasure through a tunneling effect. However, erasing one of the first store position and the second store position may lead to an erroneously erasure on the other one of the first store position and the second store position, thus, two store positions of each split-gate storage cell in the existing EEPROM may be severed as one effective store position generally.

Figure 2:
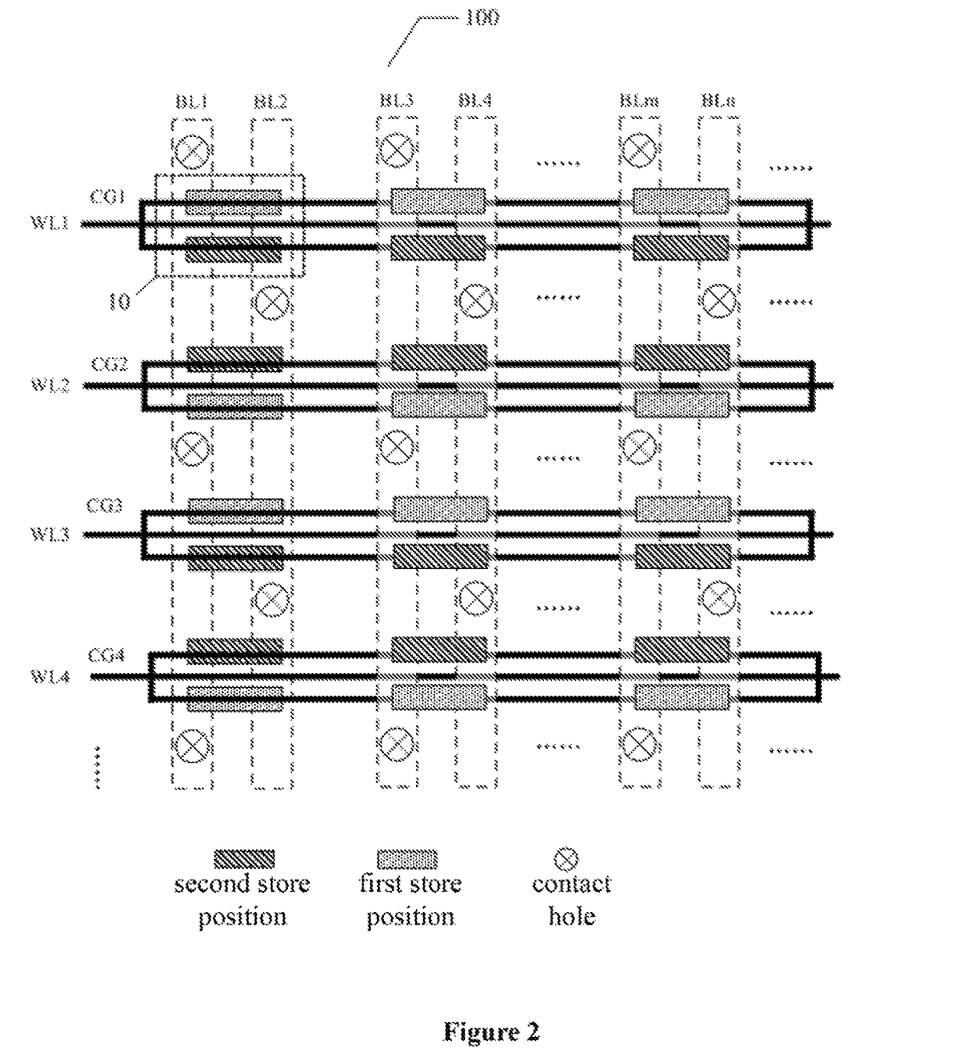
FIG. 2 is a top view of an existing EEPROM.

As shown in FIG. 2, FIG. 2 is a top view of an existing EEPROM. An existing EEPROM 100 may include a plurality of split-gate storage cells arranged in arrays (not marked in FIG. 2, please refer to the split-gate storage cell 10 in FIG. 1), the plurality of split-gate storage cells are generally formed on a P-type well. Specifically, sources of the split-gate storage cells may be connected with a first bit line through contact holes (not marked), and drains of the split-gate storage cells may be connected with a second bit line. Specifically, sources of the split-gate storage cells disposed at a first column may be connected with the first bit line BL1, and drains of the split-gate storage cells disposed at the first column may be connected with the second bit line BL2; and sources of the split-gate storage cells disposed at a second column may be connected with the first bit line BL3, and drains of the split-gate storage cells disposed at the second column may be connected with the second bit line BL4; and similarly, sources of the split-gate storage cells disposed at an $i^{th}$ column may be connected with the first bit line BLm, and drains of the split-gate storage cells disposed at the $i^{th}$ column may be connected with the second bit line BLn, i, m and n are positive integers, for example, i is 8, m is 15 and n is 16. The present disclosure is not limited thereto. Optionally, i may be a positive integral multiple of 8. The contact holes may be through holes and filled with a conductive material. The present disclosure is not limited thereto. The contact holes may be blind holes. The kind of the contact holes may be selected based on specific process requirements.

As two store positions (that is, the first store position and the second store position) of each split-gate storage cell in the EEPROM are operated as one effective store position, in a layout of circuit, the first control gates and the second control gates of the split-gate storage cells disposed at a same column may connect with a same control gate line. Specifically, take one byte (8 columns) as an example. The first control gates and the second control gates of the split-gate storage cells disposed at a first row may connect with a first control gate line CG1, and the word line gates of the split-gate storage cells disposed at the first row may connect with a first word line WL1; the first control gates and the second control gates of the split-gate storage cells disposed at a second row may connect with a second control gate line CG2, and the word line gates of the split-gate storage cells disposed at the second row may connect with a second word line WL2; the first control gates and the second control gates of the split-gate storage cells disposed at a third row may connect with a third control gate line CG3, and the word line gates of the split-gate storage cells disposed at the third row may connect with a third word line WL3; the first control gates and the second control gates of the split-gate storage cells disposed at a fourth row may connect with a fourth control gate line CG4, and the word line gates of the split-gate storage cells disposed at the fourth row may connect with a fourth word line WL4 . . . and so on.

Figure 3:
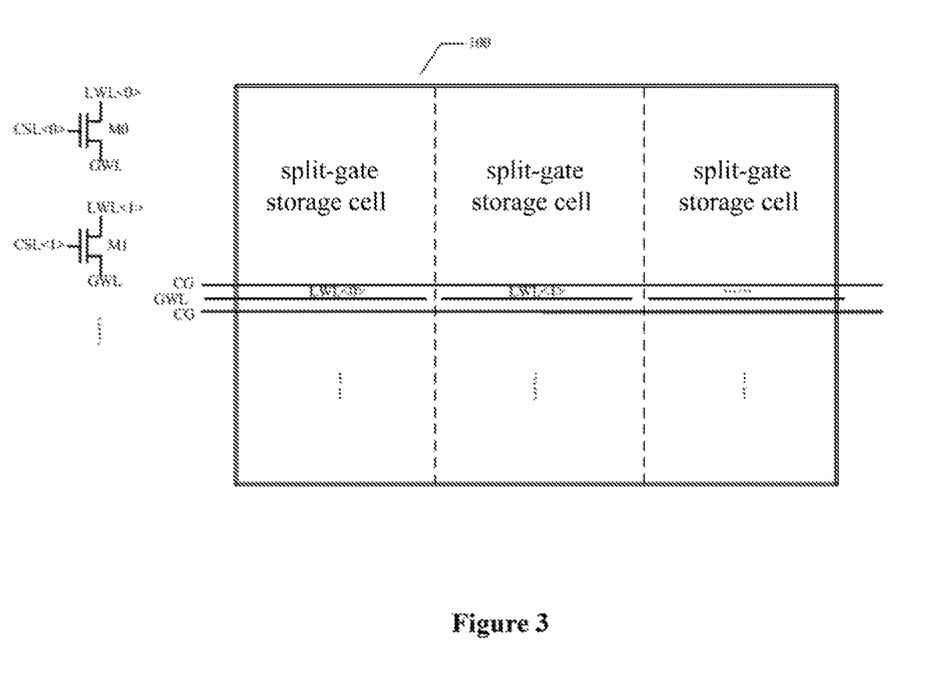
FIG. 3 is a circuit diagram of an existing EEPROM.

Further, as shown in FIG. 3, FIG. 3 is a schematic diagram of circuits of an existing EEPROM. Besides using two store positions of each of the plurality of split-gate storage cells in the EEPROM 100 as one effective store position for operation, the EEPROM 100 further includes a plurality of gating transistors (refer to M0, M1 . . . ) arranged in arrays other than the plurality of split-gate storage cells. Optionally, every 8 columns of split-gate storage cells (corresponding to 8 bits, that is, one byte) may include one of the plurality of gating transistors. Specifically, take the split-gate storage cells disposed at one column as an example. If an operation (for example, erasure) is performed on eight of split-gate storage cells at the one column, a voltage of 11 V may be applied to a chip select line CSL<0> and a voltage of 8.5 V may be applied to a local word line LWL <0>, to make a gating transistor M0 be conductive and make a voltage of a global word line GWL coupled with the word line gates of the eight split-gate storage cells is also 8.5 V, thereby realizing the operation on the eight split-gate storage cells. For a chip select line CSL<1> and a local word line LWL <1>, operations are similar. In the existing EEPROM 100, one gating transistor have to be disposed every 8 columns of split-gate storage cells, thus, an area of the existing EEPROM is large.

In summary, area utilization of the EEPROM is low.

Embodiments of the present disclosure provide an EEPROM, including a plurality of split-gate storage cells arranged in arrays, each of the plurality of split-gate storage cells including a source, a drain, a first control gate connected with a first store position, a word line gate and a second control gate connected with a second store position, wherein the first control gate and a second control gate are connected with different control gate lines, respectively, wherein every N (N is a positive integer) columns of split-gate storage cells are formed on a first well structure, and adjacent first well structures are separated by a second well structure having a different doping type with that of the first well structures to make two store positions in each of the plurality of split-gate storage cells both be performed as effective store positions respectively, thereby improving area utilization of the EEPROM.

To make above objects, features and beneficial effects of the present disclosure clearer and easier to understand, the specific embodiments of the present disclosure are described in detail below with reference to accompanying drawings.

Figure 4:
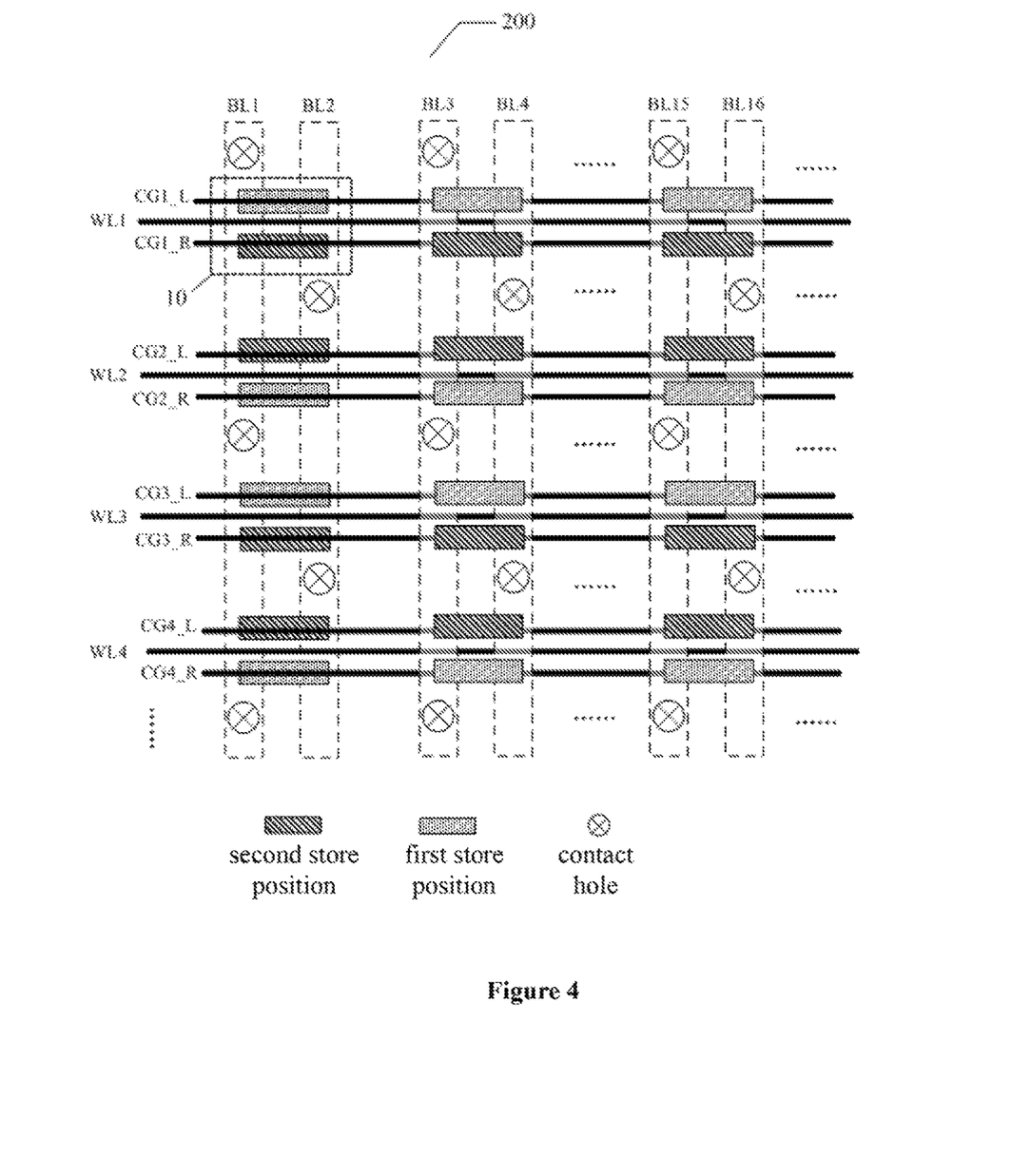
FIG. 4 is a top view of an EEPROM according to an embodiment of the present disclosure.

FIG. 4 is a top view of an EEPROM according to an embodiment of the present disclosure. According to FIG. 1 and FIG. 4, embodiments of the present disclosure provide an EEPROM 200, and the EEPROM 200 includes a plurality of split-gate storage cells 10 arranged in arrays, each of the plurality of split-gate storage cells 10 including a source (not marked), a drain (not marked), a first control gate CG0 connected with a first store position FG0 (that is, a first floating-gate), a word line gate WL and a second control gate CG1 connected with a second store position (that is, a second floating-gate). To simplify, the EEPROM including 4 rows and 8 columns of split-gate storage cells 10 is taken as an example below. In practice, a number of rows and columns of the split-gate storage cells included in the EEPROM 200 may depend on an actual requirement of storage capacity.

In the present embodiment, the word line gate WL is connected with a word line, the source is connected with a first bit line, and the drain is connected with a second bit line. Specifically, in the EEPROM 200, word line gates WL of a first row of the split-gate storage cells 10 are connected with a first word line WL1, word line gates WL of a second row of the split-gate storage cells 10 are connected with a second word line WL2, word line gates WL of a third row of the split-gate storage cells 10 are connected with a third word line WL, word line gates WL of a fourth row of the split-gate storage cells 10 are connected with a fourth word line WL4, . . . , by analogy.

In the EEPROM 200, sources of the plurality of split-gate storage cells 10 are connected with a first bit line BL1, drains of the first column of the split-gate storage cells 10 are connected with a second bit line BL1; sources of a second column of the split-gate storage cells 10 are connected with a first bit line BL3, drains of the second column of the split-gate storage cells 10 are connected with second bit line BL4, . . . , by analogy. Specifically, contact holes may be used to connect the sources and the drains with the first bit lines and the second bit lines, respectively.

Further, the first control gate CG0 is connected with the first control gate line, and the second control gate CG1 is connected with the second control gate line being different with the first control gate line. Specifically, in the EEPROM 200, the first control gate CG0 of the split-gate storage cells 10 in the first row are connected with a first control gate line CG1_L, the second control gates CG2 of the split-gate storage cells in the first row are connected with a second control gate line CG1_R; and for other control gates in the second row, the third row, the fourth row and so on, by analogy, similarly are connected with a first control gate line CG2_L, a second control gate line CG2_R, a first control gate line CG3_L, a second control gate line CG3, a first control gate line CG4_L and a second control gate line CG4_R More information on the EEPROM 200 may refer to descriptions on the existing EEPROM 100 shown in FIG. 1.

Figure 5:
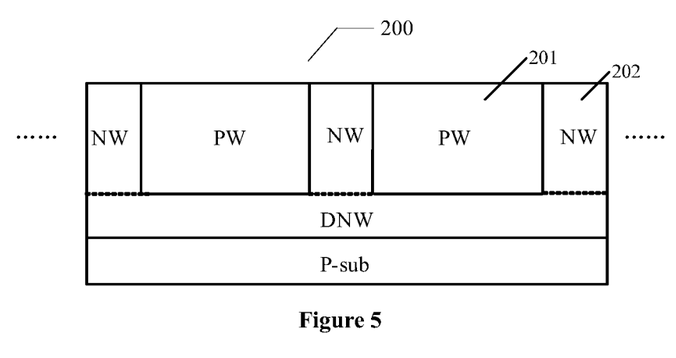
FIG. 5 is a cross-sectional view of the EEPROM in FIG. 4.

Further, as shown in FIG. 1 and FIG. 5, FIG. 5 is a cross-sectional view of the EEPROM 200 in FIG. 4, every N columns of the split-gate storage cells 10 are formed on one first well structure 201, and adjacent first well structures are separated by a second well structure 202 having a different doping type with that of the first well structures 201, wherein N is an positive integer; for example, the first well structure 201 and the second well structure 202 may be formed by depositing donor ions and acceptor ions on a substrate respectively.

In the present embodiment, every N columns of the plurality of split-gate storage cells 10 are formed on one first well structure 201, and adjacent first well structures 201 are separated by a second well structure 202 having a different doping type with that of the first well structure 201. Therefore, if an operation, for example, erasure, is performed to the split-gate storage cells 10 in the EERPEOM 200, voltages of the first well structure 201 where the split-gate storage cell 10 is disposed and the first control gate line may be configured to realize erasure of the data stored in the first store position FG0, or voltages of the first well structure 201 where the split-gate storage cell 10 is disposed and the second control gate line may be configured to realize erasure of the data stored in the second store position FG1, without using a voltage difference between the word line and the first control gate line or between the word line and the second control gate line to realize data erasure, which may avoid operation interference among different store positions in the same split-gate storage cell 10 effectively, and interferences of storage positions in split-gate storage cells 10 disposed at a same row as well as a same column with the split-gate storage cell 10, make each the two store positions in each of the plurality of split-gate storage cells 10 be effective store positions, and improve area utilization of the EEPROM. Further, in the EEPROM 200, gating transistors are not needed to select multiple columns of the split-gate storage cells 10 in the EEPROM 200 to perform operation, and only an appropriative voltage is needed to apply on the first well structure 201 where the multiple columns of the split-gate storage cells 10 disposed, which may further reduce an area of the EEPROM 200, and improve area utilization of the EEPROM.

It should be noted that, in the present embodiment, N may be any positive integer. In some embodiments, N may be 8, that is, the plurality of split-gate storage cells 10 corresponding to a capacity of one bye may be formed on the first well structure 201. The present disclosure is not limited thereto. For example, N may be an integral power of 2 (except 2 to the power of 3).

To simplify, FIG. 5 takes the EEPROM 200 including 2 rows and 8 rows of the split-gate storage cells 10 as an example.

In some embodiments, the first well structure 201 may be a P-type well PW, and the second well structure 202 may be an N-type well NW, and the P-type well PW and the N-type well NW may be formed on a P-type substrate P-sub. In some embodiments, multiple columns of the split-gate storage cells 10 in the EEPROM 200 may be formed on the P-type substrate P-sub. For example, the first well structure 201 may be formed by depositing acceptor ions on the P-type substrate P-sub, and the second well structure 202 may be formed by depositing donor ions on the P-type substrate P-sub.

Optionally, the first well structure 201 and the second well structure 202 may be formed on a highly doped N well DNW. The first well structure 201, the second well structure 202 and the highly doped N well DNW may be formed on the P-type substrate P-sub. Specifically, the highly doped N well DNW may be formed by proceeding highly doping on the P-type substrate P-sub, and the first well structure 201 may be formed by depositing acceptor ions on the highly doped N well DNW, and the second well structure 202 may be formed by depositing donor ions on the highly doped N well DNW. The N-type well NW and the highly doped N well DNW may be connected with a same potential together, thus it may be conductive between the N-type well NW and the highly doped N well DNW. Therefore, a dotted line is used to illustrate a separate relationship between the N-type well NW and the highly doped N well DNW in FIG. 5.

It should be noted that, the first well structure 201 is not limited to the P-type well PW, and the second well structure 202 is not limited to the N-type well NW. The N-type well NW and the P-type substrate P-sub may be both formed on the P-type substrate P-sub, which is not limited in the present embodiment. In practice, doping types of the first well structure 201 and the second well structure 202 may be changed, as long as the first well structure 201 and the second well structure 202 having different doping types and the second well structure 202 being capable of separating multiple first well structures 201.

Figure 6:
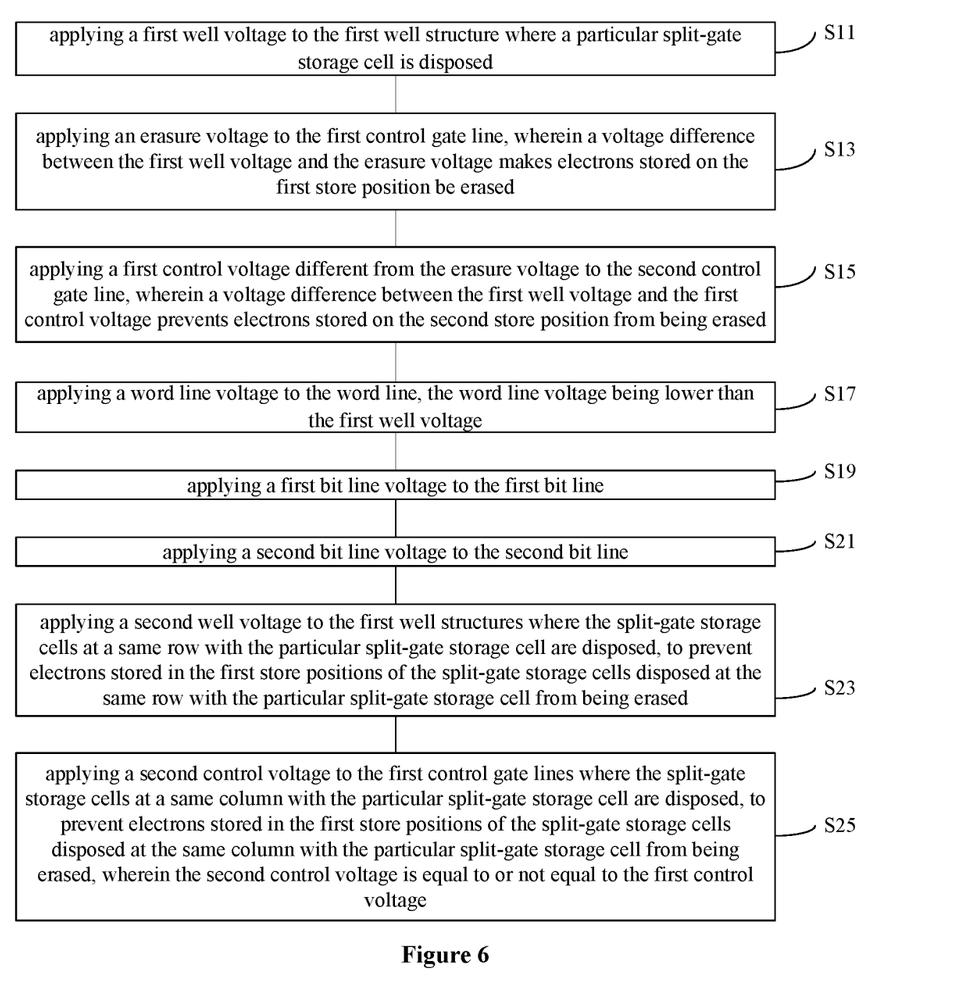
FIG. 6 is a flow chart of a method for erasing the EEPROM as shown in FIG. 4 and FIG. 5 according to an embodiment of the present disclosure.

Referring to FIG. 6, FIG. 6 schematically illustrates a flow chart of a method for erasing the EEPROM 200 as shown in FIG. 4 and FIG. 5 according to an embodiment of the present disclosure. The method for erasing the EEPROM 200 may include but not limited to following processes (taking the split-gate storage cell 10 at the first row and the first column in FIG. 4 as an example):

S11, applying a first well voltage to the first well structure 201 (as shown in FIG. 5) where a particular split-gate storage cell 10 is disposed; S13, applying an erasure voltage to the first control gate line CG1_L; S15, applying a first control voltage different from the erasure voltage to the second control gate line CG1_R; S17, applying a word line voltage to the word line WL1, the word line voltage being lower than the first well voltage; S19, applying a first bit line voltage to the first bit line BL1; and 521, applying a second bit line voltage to the second bit line BL2; wherein a voltage difference between the first well voltage and the erasure voltage makes electrons stored on the first store position FG0 be erased, and a voltage difference between the first well voltage and the first control voltage prevents electrons stored on the second store position FG0 from being erased.

In the present embodiment, as the voltage difference of the first well voltage and the erasure voltage is large enough to erase electrons stored in the first store position FG0, a first floating-gate may no longer have electrons, and the voltage difference between the first well voltage and the first control voltage (it is lower than the voltage difference between the first well voltage and the erasure voltage) prevents electrons stored on the second store position from being erased, so as to realize erasure of the first store position FG0. Further, the word line voltage is lower than the first well voltage. If a voltage difference between the word line voltage and the erasure voltage is small, it would be not big enough to erase the first store position FG0 through a tunneling effect.

As shown in Table 1, in some embodiments, the first well voltage may be within a range from 8 V to 12 V, the erasure voltage may be within a range from −6 V to −10 V, the first control voltage may be within a range from 0 V to 4 V, and the word line voltage may be within a range from −2 V to 2 V. Specifically, the first bit line voltage may be 10 V, the erasure voltage may be −8 V, the first control voltage may be 2 V and the word line voltage may be 0 V.

TABLE 1

| first well voltage | erasure voltage | first control voltage | word line voltage |
|---|---|---|---|
| 8 V~12 V | −6 V~10 V | 0 V~4 V | −2 V~2 V |

The first bit line voltage and the second bit line voltage may be any appropriate value, as long as interference can be caused to the erasure of the first store position FG0 in the split-gate storage cells 10. Specifically, for convenience, the first bit line voltage and the second bit line voltage may be equal to the first well voltage, for example, 10 V.

In some embodiments, the method for erasing the EEPROM 200 may further include S23, applying a second control voltage to the first well structure 201 where the split-gate storage cells 10 at a same row with the particular split-gate storage cell are disposed, to prevent electrons stored in the first store positions FG0 of the split-gate storage cells 10 disposed at the same row with the particular split-gate storage cell from being erased. As the erasure voltage, the first control voltage and the word line voltage configured for the split-gate storage cells 10 disposed at a same row are the same, configuring the second well structure voltage, a voltage difference between a second well voltage and the erasure voltage would not cause erasure of electrons stored in the first store position FG0 of the split-gate storage cells 10 disposed at the same row.

For example, the second well voltage may be within a range from −2 V to 2 V. The present disclosure is not limited thereto. Specifically, the second well voltage may be 0 V. The present disclosure is not limited thereto.

Specifically, the first bit line and the second bit line of the split-gate storage cells 10 disposed at a same row may be applied a voltage within a range of −2 V to 2 V, for example, 0 V.

In some embodiments, the method for erasing an EEPROM 200 may further include: S25, applying a second control voltage to the first control gate lines where the split-gate storage cells 10 at a same column with the particular split-gate storage cell are disposed, to prevent electrons stored in the first store positions of the split-gate storage cells 10 disposed at the same column with the particular split-gate storage cell from being erased, wherein the second control voltage is equal to or not equal to the first control voltage. The first well voltage, the first bit line voltage and the second bit line voltage configured for the plurality of split-gate storage cells 10 disposed at a same column are the same, thus, by configuring the second control gate voltage, a voltage difference between the first well voltage and the second control gate voltage would not cause erasure of electrons stored in the first store position FG0 of the split-gate storage cells 10 disposed at the same column.

For example, the second well voltage may be within a range from 0 V to 4 V. The present disclosure is not limited thereto. Specifically, the second well voltage may be 0 V. The present disclosure is not limited thereto.

Specifically, a word line of the split-gate storage cells 10 disposed at a same column may be applied a voltage within a range from −2 V to 2 V, for example, 0 V, and the second control gate line may be applied a voltage within a range from 0 V to 4V, for example, 2 V.

Specifically, voltages may be applied to the first bit line, the second bit line, the word line, the first control gate line and the second control gate line according to values (the unit is V) in Table 2, so as to erase the first store position FG0.

TABLE 1

| Operation | the plurality of split-gate storage cells | BL_1 | WL | CG_L | CG_R | BL2 | PW |
|---|---|---|---|---|---|---|---|
| erasure | selected | 10 | 0 | −8 | 2 | 10 | 10 |
|  | a same row with the selected | 0 | 0 | −8 | 2 | 0 | 0 |
|  | a same column with the selected | 10 | 0 | 2 | 2 | 10 | 10 |

Three kinds of split-gate storage cells are illustrated in Table 2, including a selected split-gate storage cell 10, split-gate storage cells 10 disposed at a same row with the selected split-gate storage cell 10 and split-gate storage cells 10 disposed at a same column with the selected split-gate storage cells 10. And BL_1, BL_2, WL, CG_L and CG_R represent the first bit line, the second bit line, the word line and the second control gate line connected with the three kinds of split-gate storage cells respectively. PW represents a first well voltage applied to a first well structure where the three kinds of split-gate storage cells 10 are disposed.

Figure 7:
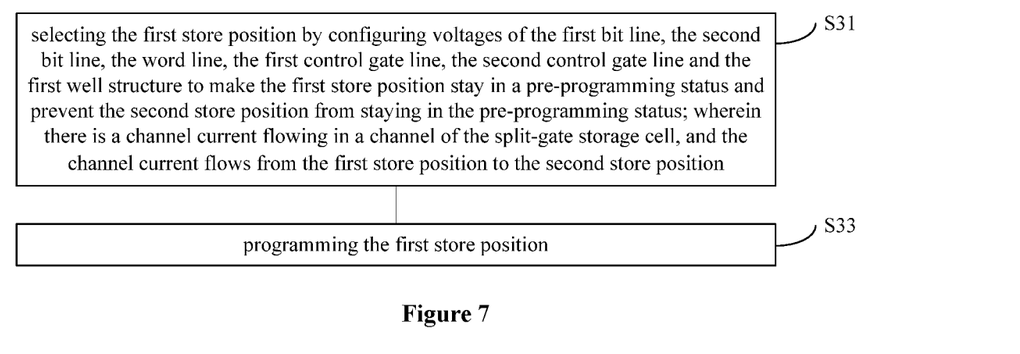
FIG. 7 schematically illustrates a flow chart of a method for programming the EEPROM as shown in FIG. 4 and FIG. 5 according to an embodiment of the present disclosure.

Referring to FIG. 7, FIG. 7 schematically illustrates a flow chart of a method for programming the EEPROM 200 as shown in FIG. 4 and FIG. 5 according to an embodiment of the present disclosure. The method for programming the EEPROM 200 may include following processes without limitation on sequences (taking a first row and a first column of the plurality of split-gate storage cells 10 in FIG. 4 as an example): S31, selecting the first store position FG0 by configuring voltages of the first bit line BL1, the second bit line BL2, the word line WL1, the first control gate line CG1_L, the second control gate line CG1_R and the first well structure 201 (as shown in FIG. 5) to make the first store position FG0 stay in a pre-programming status, and prevent the second store position FG1 from staying in the pre-programming status, wherein there is a channel current flowing in a channel of the split-gate storage cell 10, and the channel current flows from the first store position FG0 to the second store position FG1; and S33, programming the first store position FG0.

Specifically, through applying a high positive voltage to the first control gate line CG1_L connected with the first store position FG0 and applying voltages to the first bit line BL1 and the second bit line BL2 to generate the channel current between the source and the drain of each of the plurality of split-gate storage cells 10, energy of electrons transmitting between the source and the drain is increased, and if hot electrons have been injected into the first store position FG0 programmed, a programming process is finished.

As shown in Table 3, in a non limiting example, the first store position FG0 may be selected by applying a voltage within a range from 3 V to 7 V to the first bit line BL1, for example, 5 V, and applying a voltage within a range from 0.1 V to 0.5 V to the second bit line BL2, for example, 0.3 V, and applying a voltage within a range from 1 V to 2 V to the word line WL1, for example, 1.5 V, and applying a voltage within a range from 7 V to 10 V to the first control gate line CG1_L, for example 8 V, and applying a voltage within a range from 3 V to 7 V to the second control gate line CG1_R, for example 5 V, and applying a voltage within a range from −2 V to 2 V to the first well structure 201, for example, 0 V to make the channel current flow in the channel of the split-gate storage cell 10.

TABLE 3

| first bit line | second bit line | word line | first control gate line | second control gate line | first well structure |
|---|---|---|---|---|---|
| 3 V~7 V | 0.1 V~0.5 V | 1 V~2 V | 7 V~10 V | 3 V~7 V | −2 V~2 V |

Specifically, the voltage within a range from 0.1 V to 0.5 V may be generated by a voltage source or by impedances passed by currents in circuits, but it is not limited to this.

Figure 8:
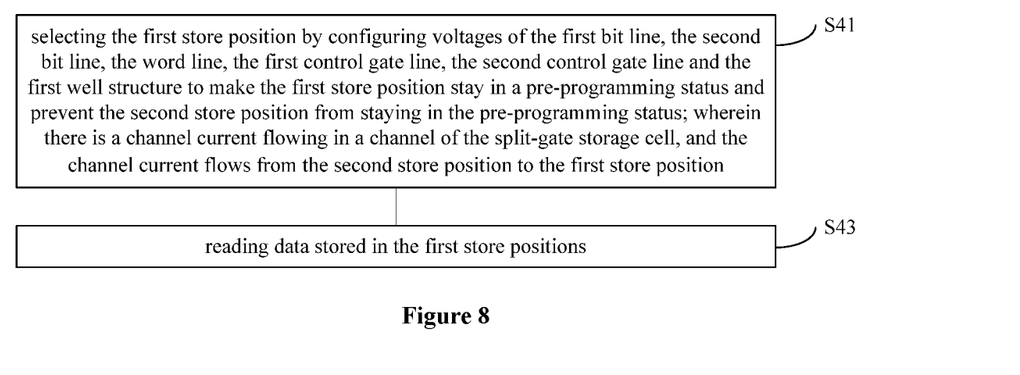
FIG. 8 schematically illustrates a flow chart of a method for reading the EEPROM as shown in FIG. 4 and FIG. 5 according to an embodiment of the present disclosure.

Referring to FIG. 8, FIG. 8 schematically illustrates a flow chart of a method for reading the EEPROM 200 according to an embodiment of the present disclosure. The method for reading the EEPROM 200 may include following processes without limitation on sequences (taking a first row and a first column of the plurality of split-gate storage cells 10 in FIG. 4 as an example):

S41, selecting the first store position FG0 by configuring voltages of the first bit line BL1, the second bit line BL2, the word line WL1, the first control gate line CG1_L, the second control gate line CG1_R and the first well structure 201 (as shown in FIG. 5) to make the first store position FG0 stay in a pre-programming status, and prevent the second store position FG1 from staying in the pre-programming status, wherein there is a channel current flowing in a channel of the split-gate storage cell 10, the channel current flows from the second store position FG1 to the first store position; and S43, reading data stored in the first store position FG0.

Specifically, a certain voltage may be applied to the word line WL1 and a voltage may be applied to the first bit line BL1 and the second bit line BL2 to make a large amount of electrons move between the source and the drain of the split-gate storage cell 10 to generate a current, i.e., the channel current. A SA (Sensitive Amplifier) may be used to read a value of a current on the first bit line BL1, so as to determine an amount of electrons stored in the first store position FG0 and further realize reading of the data stored in the split-gate storage cell 10. If the current is large, the data may be 1; and if the current is small, the data may be 0. A first input terminal of the SA may connect with a reference voltage, and a second input terminal of the SA may connect with the first bit line BL1 though a longitudinal decoder (not shown). Before a reading operation, under a selection of the longitudinal decoder, a voltage source (not shown) may be used to precharge the first bit line BL1 to make it equal to the reference voltage; and during the reading operation, the SA outputs a reading current. If the channel current on the first store position FG0 is larger than the reading current, a voltage of the second input terminal may descend; and if the channel current is 0, being smaller than the reading current, the voltage of the second input terminal may raise. The SA determines a value of the reading current according to a logic level output by itself, and further judges whether the data stored in the first store position FG0 is 1 or 0.

As shown in Table 4, in a non limiting example, the first store position FG0 may be selected by applying a voltage of 0 V to the first bit line BL1, and applying a voltage within a range from 0.5 V to 1 V to the second bit line BL2, for example, 0.8V, and applying a voltage within a range from 4 V to 5 V to the word line WL1, and applying a voltage of 0 V to the first control gate line CG_L, applying a voltage within a range from 4 V to 5 V to the second control gate line CG_R, and applying a voltage within a range from −2 V to 2 V to the first well structure 201, for example, 0 V, to make the channel current flow in the channel of the split-gate storage cell 10.

TABLE 4

| first bit line | second bit line | word line | first control gate line | second control gate line | first well structure |
|---|---|---|---|---|---|
| 0 V | 0.5 V~1 V | 4 V~5 V | 0 V | 4 V~5 V | −2 V~2 V |

It should be noted that, the first store position FG0 and the second store position FG1 are mirroring with each other, thus erasure, programming and reading method of the second store position FG1 may refer to related description of the first store position FG0 and are not described in detail here.

Although the present disclosure has been disclosed above, the present disclosure is not limited to this. Any person skilled in the art may make various changes and modifications without departing from the spirit and scope of the present disclosure. Therefore, the protection scope of the present disclosure shall be subject to the scope defined by the claims.

What is claimed is:

1. A method for erasing an Electrically Erasable Programmable Read Only Memory (EEPROM), wherein the EEPROM comprises a plurality of split-gate storage cells arranged in arrays, each of the plurality of split-gate storage cells comprises a source, a drain, a first control gate connected with a first store position, a word line gate and a second control gate connected with a second store position, the word line gate is connected with a word line, the source is connected with a first bit line, and the drain is connected with a second bit line, wherein the first control gate is connected with a first control gate line, and the second control gate is connected with a second control gate line being different with the first control gate line, wherein every N columns of split-gate storage cells are formed on a first well structure, and adjacent first well structures are separated by a second well structure having a different doping type with that of the first well structures, and N is a positive integer, wherein the method comprises:

applying a first well voltage to the first well structure where a particular split-gate storage cell is disposed;

applying an erasure voltage to the first control gate line;

applying a first control voltage different from the erasure voltage to the second control gate line;

applying a word line voltage to the word line, the word line voltage being lower than the first well voltage;

applying a first bit line voltage to the first bit line;

applying a second bit line voltage to the second bit line; and wherein a voltage difference between the first well voltage and the erasure voltage makes electrons stored on the first store position be erased, and a voltage difference between the first well voltage and the first control voltage prevents electrons stored on the second store position from being erased.

2. The method according to claim 1, wherein the first well voltage is within a range from 8 V to 12 V, the erasure voltage is within a range from −6 V to −10 V, the first control voltage is within a range from 0 V to 4 V, and the word line voltage is within a range from −2 V to 2 V.

3. The method according to claim 2, wherein the first bit line voltage and the second bit line voltage are equal to the first well voltage.

4. The method according to claim 1, wherein the first bit line voltage and the second bit line voltage are equal to the first well voltage.

5. The method according to claim 1, further comprising:

applying a second well voltage to the first well structures where the split-gate storage cells at a same row with the particular split-gate storage cell are disposed, to prevent electrons stored in the first store positions of the split-gate storage cells disposed at the same row with the particular split-gate storage cell from being erased.

6. The method according to claim 5, wherein the second well voltage is within a range from −2 V to 2 V.

7. The method according to claim 1, further comprising:

applying a second control voltage to the first control gate lines where the split-gate storage cells at a same column with the particular split-gate storage cell are disposed, to prevent electrons stored in the first store positions of the split-gate storage cells disposed at the same column with the particular split-gate storage cell from being erased, wherein the second control voltage is equal to or not equal to the first control voltage.

8. The method according to claim 7, wherein the second control voltage is within a range from 0 V to 4 V.

9. A method for programming an Electrically Erasable Programmable Read Only Memory (EEPROM), wherein the EEPROM comprises a plurality of split-gate storage cells arranged in arrays, each of the plurality of split-gate storage cells comprises a source, a drain, a first control gate connected with a first store position, a word line gate and a second control gate connected with a second store position, the word line gate is connected with a word line, the source is connected with a first bit line, and the drain is connected with a second bit line, wherein the first control gate is connected with a first control gate line, and the second control gate is connected with a second control gate line being different with the first control gate line, wherein every N columns of split-gate storage cells are formed on a first well structure, and adjacent first well structures are separated by a second well structure having a different doping type with that of the first well structures, and N is a positive integer, wherein the method comprises:

selecting the first store position by configuring voltages of the first bit line, the second bit line, the word line, the first control gate line, the second control gate line and the first well structure to make the first store position stay in a pre-programming status and prevent the second store position from staying in the pre-programming status; wherein there is a channel current flowing in a channel of the split-gate storage cell, and the channel current flows from the first store position to the second store position; and programming the first store position, wherein a voltage applied to the first bit line is higher than a voltage applied to the second bit line, and a voltage within a range from −2 V to 2 V is applied to the first well structure.

10. The method according to claim 9, wherein selecting the first store position by applying a voltage within a range from 3 V to 7 V to the first bit line, applying a voltage within a range from 0.1 V to 0.5 V to the second bit line, applying a voltage within a range from 1 V to 2 V to the word line, applying a voltage within a range from 7 V to 10 V to the first control gate line, applying a voltage within a range from 3 V to 7 V to the second control gate line, and applying the voltage within the range from −2 V to 2 V to the first well structure to make the channel current flow in the channel of the split-gate storage cell.

11. A method for reading an Electrically Erasable Programmable Read Only Memory (EEPROM), wherein the EEPROM comprises a plurality of split-gate storage cells arranged in arrays, each of the plurality of split-gate storage cells comprises a source, a drain, a first control gate connected with a first store position, a word line gate and a second control gate connected with a second store position, the word line gate is connected with a word line, the source is connected with a first bit line, and the drain is connected with a second bit line, wherein the first control gate is connected with a first control gate line, and the second control gate is connected with a second control gate line being different with the first control gate line, wherein every N columns of split-gate storage cells are formed on a first well structure, and adjacent first well structures are separated by a second well structure having a different doping type with that of the first well structures, and N is a positive integer, wherein the method comprises:

selecting the first store position by configuring voltages of the first bit line, the second bit line, the word line, the first control gate line, the second control gate line and the first well structure to make the first store position stay in a pre-programming status and prevent the second store position from staying in the pre-programming status; wherein there is a channel current flowing in a channel of the split-gate storage cell, and the channel current flows from the second store position to the first store position; and reading data stored in the first store positions, wherein a voltage applied to the first bit line is lower than a voltage applied to the second bit line, and a voltage within a range from −2 V to 2 V is applied to the first well structure.

12. The method according to claim 11, wherein selecting the first store position by applying a voltage of 0 V to the first bit line, applying a voltage within a range from 0.5 V to 1 V to the second bit line, applying a voltage within a range from 4 V to 5 V to the word line, applying a voltage of 0 V to the first control gate line, applying a voltage within a range from 4 V to 5 V to the second control gate line, and applying the voltage within the range from −2 V to 2 V to the first well structure to make the channel current flow in the channel of the split-gate storage cell.

* * * * *